(12) United States Patent
Seol et al.

(10) Patent No.: US 7,929,351 B2
(45) Date of Patent: Apr. 19, 2011

(54) METHOD FOR REDUCING LATERAL MOVEMENT OF CHARGES AND MEMORY DEVICE THEREOF

(75) Inventors: Kwang-soo Seol, Yongin-si (KR);
Young-gu Jin, Hwaseong-si (KR);
Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 12/382,790

(22) Filed: Mar. 24, 2009

(65) Prior Publication Data

US 2009/0244980 A1   Oct. 1, 2009

(30) Foreign Application Priority Data

Mar. 25, 2008   (KR) .................... 10-2008-0027592

(51) Int. Cl.
*G11C 11/34*   (2006.01)

(52) U.S. Cl. .......... 365/185.22; 365/185.18; 365/185.17
(58) Field of Classification Search ............. 365/185.22, 365/185.18, 185.17
See application file for complete search history.

(56) References Cited

U.S. PATENT DOCUMENTS

| 5,949,714 | A * | 9/1999 | Hemink et al. .......... 365/185.17 |
| 2007/0206424 | A1 * | 9/2007 | Kuo et al. ................ 365/185.29 |

* cited by examiner

*Primary Examiner* — Huan Hoang
(74) *Attorney, Agent, or Firm* — Harness, Dickey & Pierce, P.L.C.

(57) ABSTRACT

Provided is a method and device for reducing lateral movement of charges. The method may include pre-programming at least one memory cell that is in an erased state by applying a pre-programming voltage to the at least one memory cell to have a narrower distribution of threshold voltages than the at least one erased state memory cell and verifying that the pre-programmed memory cell is in the pre-programmed state using a negative effective verifying voltage.

20 Claims, 12 Drawing Sheets

METHOD FOR REDUCING LATERAL MOVEMENT OF CHARGES AND MEMORY DEVICE THEREOF

PRIORITY STATEMENT

This application claims the benefit of Korean Patent Application No. 10-2008-0027592, filed on Mar. 25, 2008, in the Korean Intellectual Property Office, the disclosure of which is incorporated herein in its entirety by reference.

BACKGROUND

1. Field

Example embodiments relate to a memory device and a method of operating the memory device, for example, to a memory device and a method of operating a memory device for reducing a lateral movement of charges, which may be caused by an electrostatic attraction force of the charges stored in memory cells of the memory device, so as to preserve information for a longer period of time.

2. Description of the Related Art

Among semiconductor memory devices, non-volatile memory devices may preserve data even when a power supply to the non-volatile memory devices is stopped.

Floating gate-type flash memories, which may operate by storing charges in a floating gate formed of polycrystalline silicon, may be used as non-volatile memories with large storage capacities.

Memory cells of a flash memory device may be classified into a single-level cell (SLC) recording two levels of a recording state (1 and 0) therein and a multi-level cell (MLC) recording four or more levels of a recording state (for example, 11, 01, 00, and 10) therein.

The MLC technology may increase the storage capacities of NAND type flash memories and NOR type flash memories.

In operating the MLC, the distribution of threshold voltages Vth corresponding to the recording states may be reduced so that each of the recording states may be separately recognized.

In the flash memory that uses the floating gate, when the sizes of the memory cells are reduced, it may be difficult to control the distribution of the threshold voltages Vth due to an increase in a coupling between the memory cells, for example, the coupling between the floating gates of the memory cells.

To solve the above problem, charge trap flash (CTF) memory devices that include an insulating layer having a charge trap site are using a charge trap layer, such as silicon nitride ($Si_3N_4$), as a charge storage layer instead of using the floating gate.

In CTF memory devices, since the charges are trapped in the insulating layer having the charge trap site such as the silicon nitride $Si_3N_4$, the trapped charges may move between charge trap sites of the insulating layer by tunneling or hopping, when the electrostatic force between the charges stored in adjacent memory cells strengthens.

In programming the CTF memory device, a voltage of 0V may be applied to an active region corresponding to a selected bit line, and a power voltage Vcc may be applied to unselected bit lines. At a same time, a programming voltage Vpgm may be applied to selected word lines and a pass voltage Vpass may be applied to unselected word lines. Due to the above programming, electrons may be injected into the memory cell, on which the selected bit line and the selected word line overlap each other, through a tunneling oxide layer. The injected electrons may be trapped and stored by charge trap sites that are scattered in the charge trap layer.

When programming the MLC, an incremental step pulse programming (ISPP) method may perform the programming while repeatedly boosting the programming voltage Vpgm by a predetermined value in order to reduce the distribution of the threshold voltages Vth of the memory cells respectively corresponding to levels of the programmed state.

On the other hand, when data stored in the CTF memory device is erased, an erasing voltage Vers may be applied to a bulk portion and the voltage of 0V may be applied to all of the word lines so as to erase the data in a block unit. Here, in the memory device, a block may include a plurality of pages, and a page may be defined as the memory cells connecting to one word line when a plurality of memory cells that are connected to a bit line in series form a string in a NAND type flash memory device. The reading operation and the programming operation may be performed in a page unit, and the erasing operation may be performed in the block unit.

When the erasing operation is performed, holes may be injected into the charge trap layer from the active region through the tunneling oxide layer, to neutralize and erase the electrons stored in the memory cells in the programming operation.

Since the data may be erased from all of the memory cells included in a block, the threshold voltages Vth in the erasing operation may be highly scattered and the distribution of the threshold voltages Vth may not be controlled, unlike in the programming operation. Due to the above characteristic, the erasing operation may be sufficiently performed to erase the data from all of the memory cells, and consequently, the distribution of the threshold voltages Vth in the erasing operation may have a negative value of wide range, for example, from 0V to −3V.

On the other hand, since the memory cells in the programmed state have the positive threshold voltages, a difference between the charge potentials of the memory cells in the programmed state and the erased state may be greater. Due to the difference between the charge potentials, the charges stored in the charge trap layer may move in the direction of the word lines.

When the stored charges slowly move in the direction of the word lines after performing the programming operation, the threshold voltages of the memory cells in the programmed state may be reduced gradually, and thus, the stored data may be lost. Therefore, the moving of charges stored in the charge trap layer in the direction of the word lines may degrade a reliability of the CTF memory device.

SUMMARY

Example embodiments provide a method and device, so as to improve a data retention property in a memory device by reducing a lateral movement of charges.

According to example embodiments, a method for reducing lateral movement of charges may include pre-programming at least one memory cell that is in an erased state by applying a pre-programming voltage to the at least one memory cell to have a narrower distribution of threshold voltages than the at least one erased state memory cell and verifying that the pre-programmed memory cell is in the pre-programmed state using a negative effective verifying voltage.

At least one of the pre-programming and the verifying may use the negative effective verifying voltage one or more times until the memory cell passes a verification to be in the pre-programmed state.

The negative effective verifying voltage may be between −2 volts (V) and 0 V.

One or more of the threshold voltages in the pre-programmed state may be less than 0 V.

Example embodiments may further include programming the pre-programmed memory cell using the negative effective verifying voltage, so as to have the threshold voltages of a desired programmed state.

Example embodiments may further include erasing a previously programmed state of the memory cell before performing the pre-programming.

The erasing may be performed on a plurality of memory cells until each of the memory cells have threshold voltages of less than 0 V.

According to example embodiments, a memory device may include an array of a plurality of memory cells sharing at least one of a source and drain formed in a p-well of a semiconductor substrate, wherein a first voltage and a second voltage that are greater than 0V are applied to the p-well and a common source, a voltage of one of 0V and a positive third voltage that is less than the first and second voltages is applied to a selected memory cell during verification of a pre-programmed state of the memory cell, so that the negative effective verifying voltage is applied to the selected memory cell.

The first and second voltages applied to the p-well and the common source may have a same voltage.

The first and second voltages may be greater than 0V and equal to or less than 2V.

The drain may be connected to a bit line, and a bit line voltage that is applied to the drain may increase in relation to the voltage applied to the p-well when verifying the pre-programmed state of the memory cell.

Example embodiments may further include an N-well formed in the semiconductor substrate, with the P-well formed in the N-well, wherein the first voltage is applied to the N-well.

The memory device may be a NAND type flash memory device in which the plurality of memory cells are arranged as a NAND type.

The memory cell may be a charge trap flash memory cell.

The voltage of 0V may be applied to a selected memory cell.

The positive third voltage that is less than the first and second voltages may be applied to a selected memory cell.

BRIEF DESCRIPTION OF THE DRAWINGS

The above and other features and advantages will become more apparent by describing in detail example embodiment thereof with reference to the attached drawings in which.

DETAILED DESCRIPTION

Figure 1:
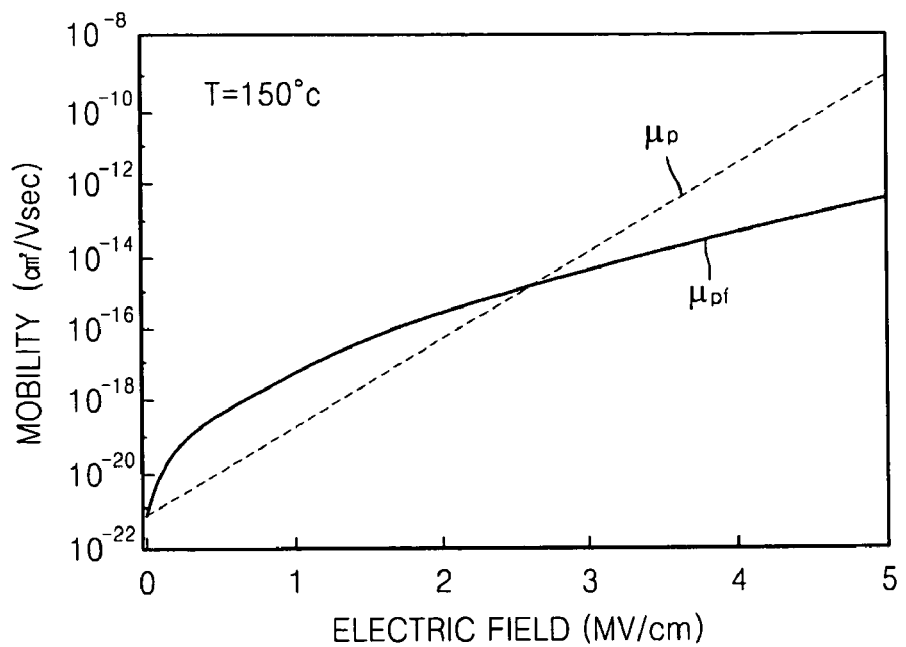
FIG. 1 is a graph showing mobility variation of electrons, according to an electric field.

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments, example embodiments will be described in detail with reference to the attached drawings. However, example embodiments are not limited to the embodiments described herein, but may be embodied in various forms. In the figures, if a layer is formed on another layer or a substrate, it means that the layer is directly formed on another layer or a substrate, or that a third layer is interposed there between.

Referring to FIG. 1, in a material, such as a silicon nitride, which forms a charge trap layer, a mobility of charges may change non-linearly according to an intensity of an electric field that is applied to the charge trap layer. For example, as the intensity of the electric field increases, the mobility of the charges may increase in speed.

FIG. 1 shows a change in the mobility of electrons according to an electric field, at a temperature of 150° C., and $\mu_p$ is the mobility calculated by using a Poole model and $\mu_{pf}$ is the mobility calculated by using a Poole-Frenkel model. As shown in FIG. 1, when the electric field increases from 1 megavolt ($10^6$ volts) per centimeter (MV/cm) to 2 MV/cm, the mobility may increase by 100 times or more.

Figure 2:
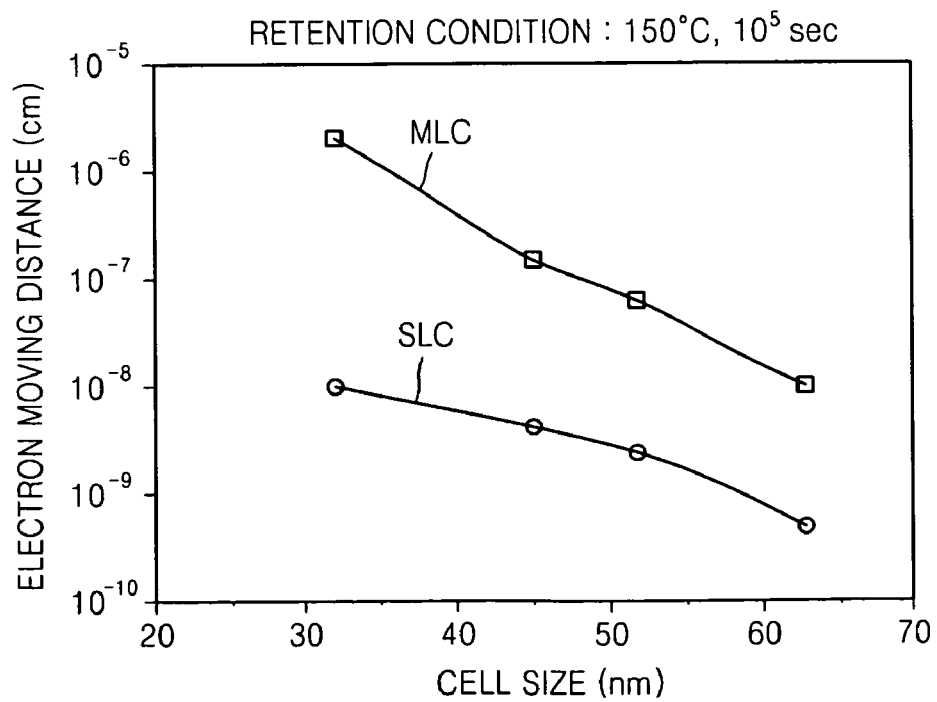
FIG. 2 is a graph showing moving distances of electrons, which are calculated based on a distance between two adjacent memory cells in the programmed state and the erased state, respectively.

FIG. 2 is a graph showing moving distances of electrons, which are calculated according to a distance between two adjacent memory cells in the programmed state and the erased state, respectively. In FIG. 2, the moving distances of the electrons are calculated in consideration of the electron mobility in a silicon nitride trap layer, and a retention condition was 150° C. and $10^5$ seconds.

If a memory device operates as a single-level cell (SLC) unit, memory cells may be generally classified as memory cells in a programmed state ("0" state) and memory cells in an erased state ("1" state). In addition, a threshold voltage corresponding to the programmed state ("0" state) may range, for example, from about from 1 V to 3 V, and a threshold voltage corresponding to the erased state ("1" state) may range, for example, about from −0.5 V to −2.0 V.

Therefore, a maximum electric field generated between the two adjacent memory cells may be calculated using a function of a potential difference between the maximum threshold voltage of the programmed state (3V) and the minimum threshold voltage of the erased state (−2.0V) with respect to the distance between the adjacent memory cells.

For example, in the memory device having SLCs, when the distance between the adjacent memory cells is 32 nm and the memory cell in the programmed state has a maximum threshold voltage and the adjacent memory cell in the erased state has a minimum threshold voltage, a lateral electric field is about 1 MV/cm, and the moving distance of the charge is about 0.2 nm under the retention condition of 150° C. and $10^5$ sec. This means that an initial status of the stored data may be maintained because the lateral movement of the electrons rarely occurs even when the data is preserved for a long period of time.

However, in a memory device having multi-level cells (MLCs) of four levels, the memory cells may be in three levels of a programmed state, such as, a "00" state, a "01" state, or a "10" state, and may be in a level of an erased state, such as, a "11" state. In addition, since the programmed state is divided into three levels, the maximum threshold voltage in the programmed state may be, for example, about 3.5V, and the threshold voltage in the erased state may range from, for example, from −4V to −2V. In this case, when the distance between the adjacent memory cells is 32 nm and the memory cell in the programmed state has the maximum threshold voltage and the adjacent memory cell in the erased state has the minimum threshold voltage, the lateral electric field between the memory cells is close to 2 MV/cm and the moving distance of the trapped electron is about 20 nm under the retention condition, for example, $10^5$ sec. at a temperature of 150° C. This means that most of the electrons stored in the memory cell may move to the adjacent cell when the data is preserved in the memory cell for a long period of time, and thus, the initial status of the data may not be maintained.

In a NAND flash memory device having a capacity of 64 Gbits, a size of a memory cell may be about 30 nm.

Therefore, in order to realize a charge trap flash (CTF) memory device having, for example, a capacity of 64 gigabits (Gbits) or higher, an operating method that may improve a data retention property by preventing charges from laterally moving may be required.

According to a method of operating a memory device of example embodiments, the data retention property may be improved by preventing the charges from laterally moving, for example, in the CTF memory device having the high capacity of 64 Gbits or higher.

According to the method of operating the memory device according to example embodiments, a memory cell in the erased state may be pre-programmed so as to reduce a distribution of the threshold voltages in an effective state, for example, a "11" state, obtained by a result of the pre-programming, to be lower than that of the erased state using one effective level in the conventional programming method. At the same time, the threshold voltages of the effective state may be moved so that the threshold voltage may be less than 0V or a part of the threshold voltage range may be less than 0V. Here, according to the method of operating the memory device of example embodiments, the erased state signifies that the erasing operation is performed, for example, the erased state does not remain as a level after the programming operation, unlike a conventional programming operation. Rather, the state obtained as a result of the pre-programming remains as an effective state, for example, a "11" state, after the programming operation, and occupies a level.

As described above, according to the method of operating the memory device according to example embodiments, a memory cell that is in the erased state may change to an effective state having a small distribution of the threshold voltage through a pre-programming operation. Here, if the threshold voltages of the memory cell are moved so that the threshold voltages in the effective state are less than 0V or some of the threshold voltages are less than 0V, a memory window, for example, a region between the minimum threshold voltage in the effective state (for example, a "11" state) obtained from the pre-programming and the maximum threshold voltage in the programmed state (for example, the maximum threshold voltage in the "10" state), may be reduced. Therefore, the movement of charges caused by the lateral electric field between the memory cells may be prevented, and the degradation of the data storage status may be prevented.

The method of operating the memory device according to example embodiments may be applied to the memory device, which has a plurality of memory cells arranged on a semiconductor substrate, performing an erase operation in the block unit, which includes all of or some of the memory cells, and recording data using charge storage and having a structure that may cause a movement of charges by a difference in electric potentials of charges in the adjacent memory cells, for example, a charge trap flash (CTF) memory device.

Figure 3:
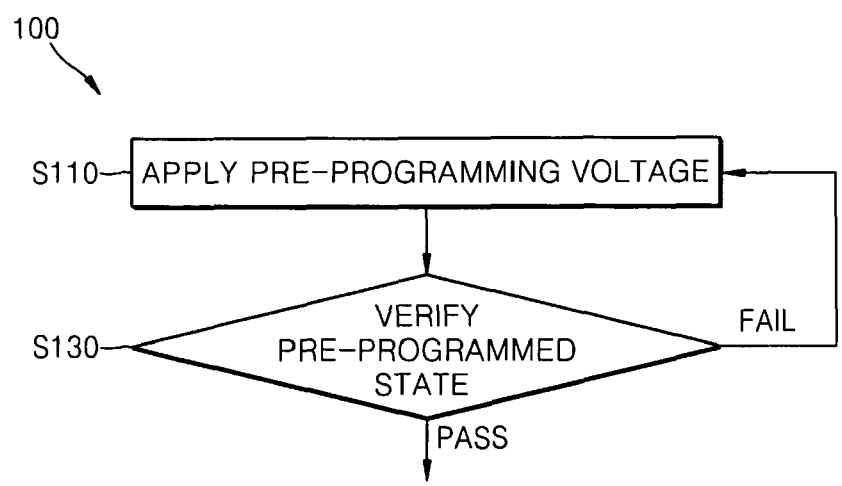
FIG. 3 is a flowchart illustrating a method of operating a memory device, according to example embodiments.

FIG. 3 is a flowchart illustrating the method of operating the memory device, according to example embodiments. In the method of operating the memory device, after an erasing operation and before performing a programming operation, a pre-programming operation 100 of a memory cell that is in an erased state may be performed to change the erased state (hereinafter, referred to as dummy state in order to distinguish this erased state from an erased state of a conventional programming operation) to an effective state having a small distribution of threshold voltages, for example, a "11" state. Thus, the threshold voltages in the effective state may be less than 0V, or some of the threshold voltages may be less than 0V.

Referring to FIG. 3, the pre-programming operation 100 may include applying a pre-programming voltage to a memory cell in the dummy state obtained after performing the erasing operation (S110), and verifying the pre-programmed memory cell using a negative effective verifying voltage (S130).

The pre-programming operation 100 may be performed before performing the programming operation and after the erasing operation. When the memory cell is changed to the effective state (corresponding to the erased state of the conventional programming operation) having a narrow distribution of threshold voltages due to the pre-programming operation 100, the memory cell may undergo a verification process using the negative effective verifying voltage (Vv), and then, the pre-programming operation 100 may be complete. If the memory cell fails the verification, the pre-programming voltage may be applied to the memory cell again (S110) in order to perform the pre-programming operation, and then, the verification process using the negative effective verifying voltage may be performed again (S130). As described above, the application of the pre-programming voltage (S110) to the memory cell and the verification of the pre-programmed state of the memory cell using the negative effective verifying voltage (S130) may be repeatedly performed once or more until the memory cell passes the verification.

When the pre-programming operation 100 is finished because the memory cell has passed the verification, the pre-programmed memory cell may be programmed so as to have threshold voltages in a desired programmed state.

Hereinafter, a state of the memory cell, which is pre-programmed and has passed the verification process using the negative effective verifying voltage, will be referred to as a pre-programmed state. According to the method of operating the memory device according to example embodiments, after performing the programming operation, the memory cells may be in the pre-programmed state or in one or more levels of a programmed state. In a case of the multi-level memory device of four levels, the pre-programmed state may be a "11" state, and the programmed states may be "01", "00", and "10" states. However, the programmed states may include the pre-programmed state.

In the method of operating the memory device according to example embodiments, the pre-programming voltage applied to the memory cell may be the same as the programming voltage in the programming operation.

For example, the pre-programming voltage may be 15V or greater. When the pre-programming voltage is applied a plurality of times to the memory cell, the applied pre-programming voltages may be constant. In addition, like in an incremental step pulse programming (ISPP) method, the pre-programming operation may be performed repeatedly while increasing the pre-programming voltage gradually. For example, when it is determined that the memory cell is not in the pre-programmed state as a result of a previous pre-programming operation, the next pre-programming voltage may be greater than the previous pre-programming voltage by as much as 0.1V.

In addition, the negative effective verifying voltage may be between −2V and 0V.

In this case, the minimum threshold voltage of the pre-programmed memory cell may be the same as the negative effective verifying voltage or greater, and a distribution of the threshold voltages may have a smaller range than that in the dummy state (erased state). Therefore, the threshold voltages in the pre-programmed state (for example, a "11" state) may be less scattered than the threshold voltages of the dummy state (erased state).

Figure 4:
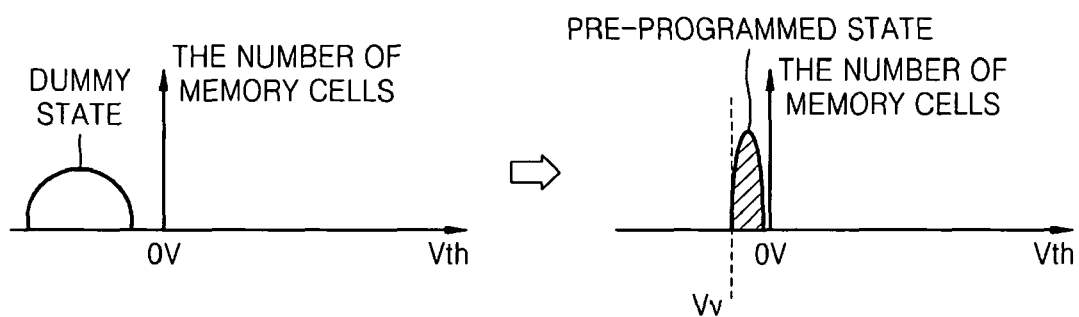
FIG. 4 is a diagram showing a dummy state (erased state) changing to an effective state (pre-programmed state) having a narrow distribution of the threshold voltages, when the memory device is driven by the operating method of example embodiments.

FIG. 4 is a diagram showing the dummy state (erased state) changing to the effective state (pre-programmed state) having a narrow distribution of the threshold voltages when the operating method according to example embodiments is used. In FIG. 4, a graph on the left side of the figure shows the distribution of the threshold voltages of the memory cell in the dummy state (for example, the state before performing the pre-programming operation that is after the erase operation), and a graph on the right side of the figure shows the distribution of the threshold voltages of the memory cell in the pre-programmed state, for example, the memory cell passing the verification process using the negative effective verifying voltage (Vv). In FIG. 4, the threshold voltages in the pre-programmed state may be less than 0V. However, some of the threshold voltages in the pre-programmed state may be greater than 0V.

As described above, after performing the pre-programming operation and the verification process using the negative effective verifying voltage Vv, the distribution of the threshold voltages may be less than that before performing the pre-programming operation, as shown in FIG. 4. Since the pre-programming operation 100 may be repeatedly performed until the memory cell passes the verification process using the negative effective verifying voltage Vv, the memory cells that have passed the verification process may change to the pre-programmed states having narrow distribution. At the same time, the memory cells in the pre-programmed state may have the threshold voltages, some of which may be less than 0V or greater than 0V.

Figure 5:
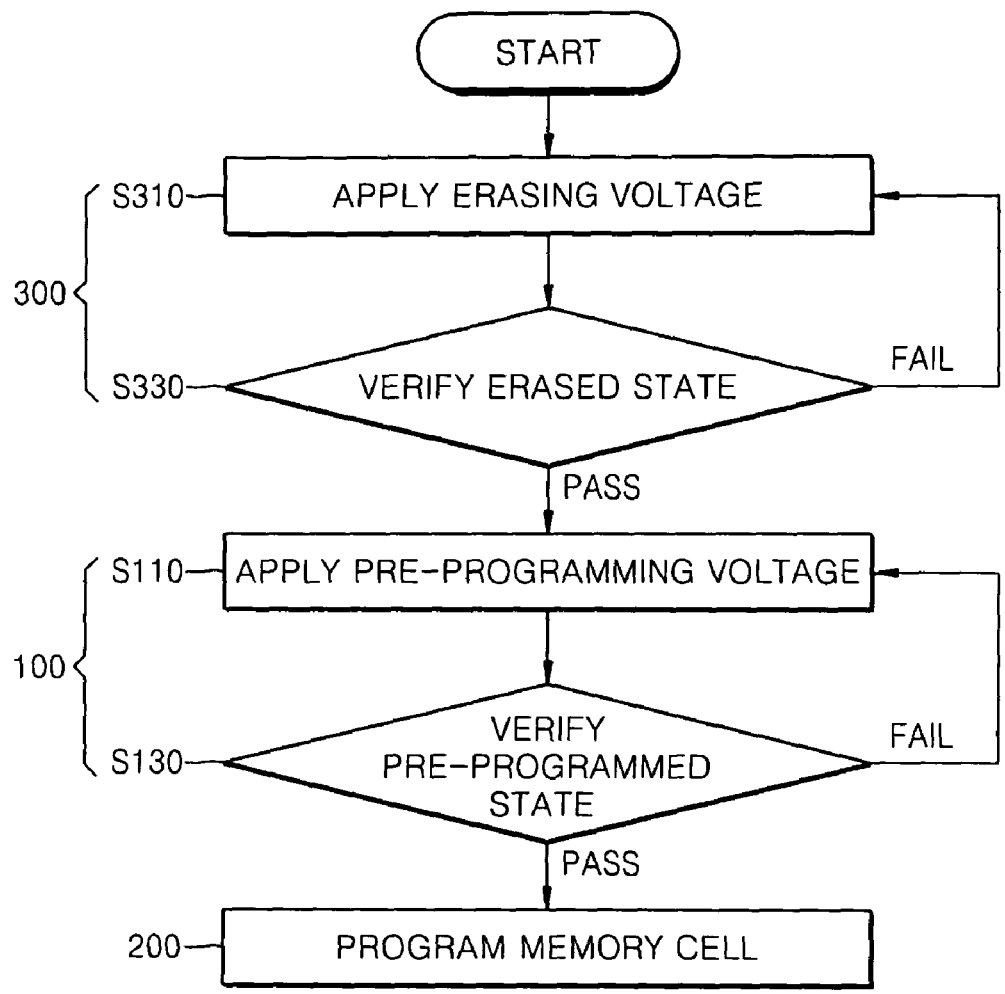
FIG. 5 is a flowchart further illustrating the programming scheme of a memory device using the pre-programming operation shown in FIG. 3, according to example embodiments.

FIG. 5 is a flowchart further illustrating the programming scheme of a memory device using the pre-programming operation shown in FIG. 3, according to example embodiments.

Referring to FIG. 5, the entire programming scheme may include the pre-programming operation 100 for the memory cell to be in the pre-programmed state, and a programming operation 200 for programming the memory cell to be in a programmed state of a desired level. In addition, the entire programming scheme may further include an erasing operation 300 for erasing the programmed state of the memory cell before performing the pre-programming operation 100.

In the erasing operation 300, for example, an erasing voltage may be applied to memory cells in bulk (for example, a p-well) by a block unit (S310), and it may be verified whether the memory cell is in the erased state so as to have a negative threshold voltage (S330). If the memory cells fail the erase verification, the erasing voltage may be applied to the memory cells again to perform the erasing operation again. The application of the erasing voltage and the erase verification may be repeatedly performed more than once until the memory cells pass the erase verification.

Figure 6:
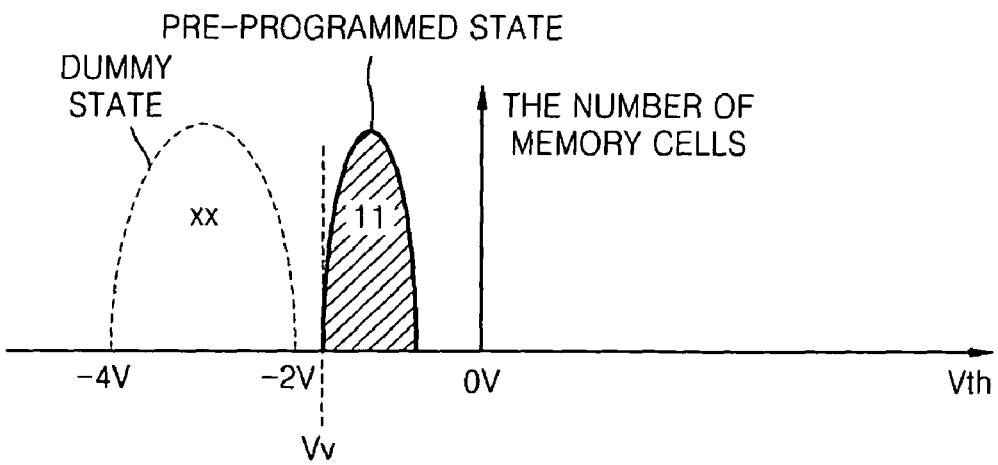
FIG. 6 is a diagram showing the dummy state changing to the programmed state when the memory cell is pre-programmed using the operating method of example embodiments.

Since the erasing operation may be performed in the block unit, the dummy state (represented as an "xx" state when the memory device operates with four levels) having the negative threshold voltages and a wide distribution of the threshold voltages may be obtained as shown in FIG. 6. The dummy state may signify that an erasing has been performed, and does not remain in a state level after the programming operation is finished, unlike in the conventional programming method. The dummy state may be obtained by erasing the memory cells included in the block using the same erasing method as in the conventional erasing method.

As described above, the erasing operation may be finished when all of the memory cells in the block have negative threshold voltages, and then, the pre-programming operation 100, for example, a program initializing process, may be performed. In the pre-programming operation 100, the memory cells that will be programmed may be changed from the dummy states ("xx" states) to pre-programmed states ("11" states when the programmed state is divided into four levels). As described above with reference to FIG. 3, in the pre-programming process, the application of the pre-programming voltage (S110) and the verification process using the negative effective verifying voltage Vv (S130) may be repeatedly performed more than once until the memory cells pass the verification.

For example, it may be assumed that the threshold voltages of the memory cells range from −2V to −4V after performing the erasing operation 300, as shown in FIG. 6. When the memory cells in the dummy states are pre-programmed until the memory cells pass the verification process using the negative effective verifying voltage Vv according to the operating method according to example embodiments, the memory cells may change to the pre-programmed states (for example, "11" states) from the dummy states (for example, "xx" states). Here, the threshold voltages of the memory cells in the pre-programmed states may be less scattered than those of the memory cells in the dummy states, and at least some of the threshold voltages of the memory cells in the pre-programmed states may be less than 0V.

The minimum threshold voltage of the memory cell in the pre-programmed state may be equal to or greater than the negative effective verifying voltage Vv. The negative effective verifying voltage Vv may not be less than the maximum threshold voltage of the memory cell in the dummy state, which does not remain as a level after the programming operation, and may be less than 0V. For example, when the maximum threshold voltage of the memory cell in the dummy state is −2V, the negative effective verifying voltage Vv may satisfy a condition −2V≦Vv<0V.

Therefore, in the conventional programming method, the minimum threshold voltage of the memory cell in the erased state, which remains as a level after performing the programming operation, is, for example, −4V. However, in the programming scheme according to example embodiments, the minimum threshold voltage of the memory cell in the pre-programmed state, which is obtained by the pre-programming process and remains as a level after the programming operation, may satisfy the condition −2V≦Vv<0V. In addition, the threshold voltages of the memory cells in the erased states according to the conventional programming method may range, for example, from −4V to −2V. However, in example embodiments, the threshold voltages of the memory cells in the pre-programmed states may be less scattered than those of conventional memory cells in the erased states. For example, the threshold voltages of the memory cells in the pre-programmed states may range from −1.5V to −0.5V when the negative effective verifying voltage is −1.5V.

Figure 7A:
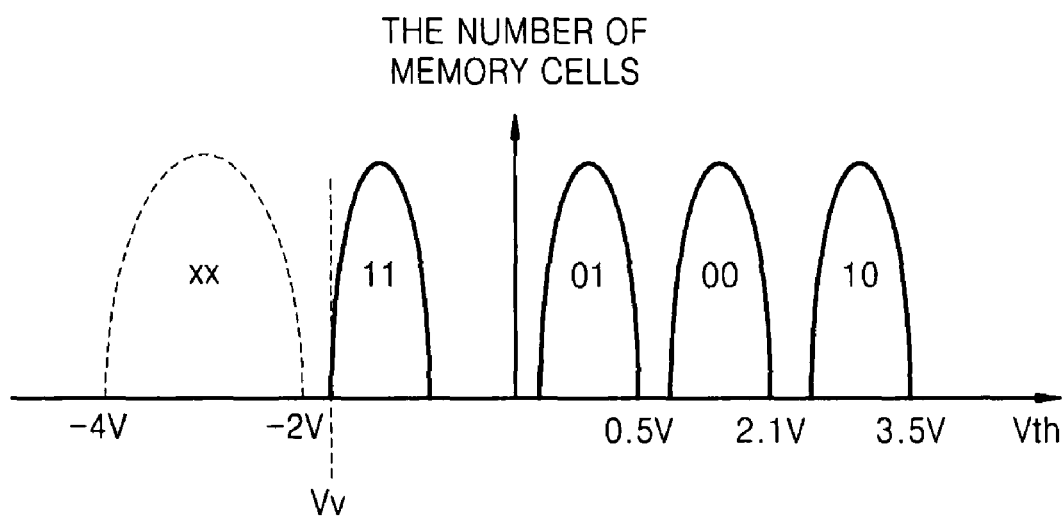
FIG. 7A is a diagram showing four levels of the programmed state obtained by performing the programming scheme of example embodiments.
Figure 7B:
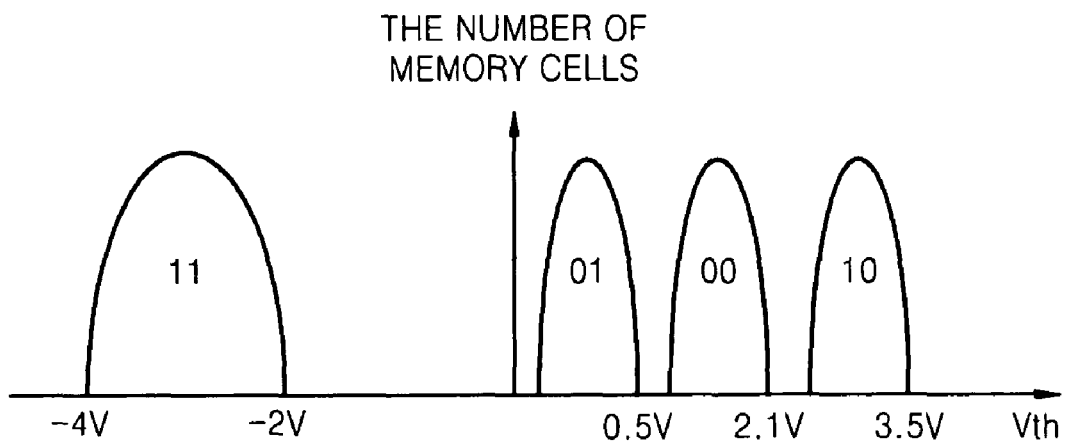
FIG. 7B is a diagram showing four levels of the programmed state obtained by performing the conventional programming method as a comparative example.

Therefore, according to the method of operating a memory device of the present embodiment, a difference between the minimum threshold voltage and the maximum threshold voltage of the memory cells in the effective levels after programming the memory cells may decrease. At the same time, an effective distance between the levels of the programmed states may be maintained as depicted in FIGS. 7A and 7B. For example, a difference between the minimum threshold voltage of the memory cell in the initial state existing as an effective level before programming, for example, the pre-programmed state, and the maximum threshold voltage of the memory cell in the programmed state (for example, a difference between the minimum threshold voltage of the memory cell in the "11" state and the maximum threshold voltage of the memory cell in the "10" state when the programmed state of the memory cell include four levels) may decrease, and the effective distance between the levels in the programmed state may be pre-existentially maintained.

Therefore, a difference between the charge potentials of the memory cell in the programmed state and the memory cell in the pre-programmed state may decrease, and thus, lateral movement of the charges may be reduced and a data retention property may be improved.

In the above description, the negative effective verifying voltage Vv may be equal to or greater than the maximum threshold voltage of the dummy state (corresponding to the erased state of the conventional programming method). However, example embodiments may not be limited to the above example. For example, the negative effective verifying voltage Vv may be any value that is greater than the minimum threshold voltage of the dummy state and less than the maximum threshold voltage of the dummy state, within a range satisfying the objective to reduce a size of the memory window and to reduce the lateral movement of the charges.

FIG. 7A shows the four levels of a programmed state obtained by performing the programming scheme of example embodiments, and FIG. 7B shows four levels of a programmed state obtained by performing the conventional programming method as a comparative example.

In FIGS. 7A and 7B, for the comparison, it is indicated as an example that the threshold voltages of the dummy state ("xx" state) and the conventional erased state ("11" state) range from −4V to −2V, the threshold voltages of the pre-programmed state ("11" state) of example embodiments range from −1.5V to −0.5V, and the maximum threshold voltages of the three levels of programmed states, for example, "01", "00", and "10" states, are 0.5V, 2.1 V, and 3.5V, respectively.

Referring to FIGS. 7A and 7B, the minimum threshold voltage in the pre-programmed state ("11" state) obtained by performing the pre-programming operation in example embodiments is, for example, −1.5V, while the minimum threshold voltage of the conventional erased state ("11" state) is −4V.

In this case, the difference between the minimum threshold voltage −1.5V and the maximum threshold voltage 3.5V of the four levels in example embodiments is 5.0V.

Therefore, when a distance between the adjacent memory cells is, for example, 32 nm, and the memory cell in the programmed state has the maximum threshold voltage and the adjacent memory cell in the pre-programmed state has the minimum threshold voltage, the lateral electric field may be close to 1 MV/cm. Therefore, when the data is preserved for a longer period of time, the lateral movement of charges may be rarer, as depicted in FIGS. 1 and 2, and thus, the initial input status of the data may be maintained.

On the other hand, according to the conventional programming method, a difference between the minimum threshold voltage −4V and the maximum threshold voltage 3.5V of the four levels is 7.5V, and as depicted in FIGS. 1 and 2, the lateral electric field generated when the memory cell in the programmed state has the maximum threshold voltage and the adjacent memory cell in the erased state has the minimum threshold voltage is about 2 MV/cm. Therefore, most of the electrons preserves in the memory cell may move to an adjacent memory cell when the memory cell stores the data for a long period of time, and thus, the initial input status of the data may not be maintained.

The order of levels "01", "00", and "10" of the programmed state when performing the programming method of example embodiments are used as an example, and example embodiments are not limited thereto. The order of programmed levels may vary.

In addition, the programming of each of the levels "01", "00", and "10" may be performed by controlling the distribution of the threshold voltages using the ISSP method. The ISPP method may be a programming method that repeatedly performs the programming process and the verifying process while boosting the programming voltage Vpgm gradually so as to reach the desired threshold voltage value. As described above, the pre-programming also may be performed using the ISSP method. In addition, when the memory cell in the pre-programmed state is programmed to be the desired level, the ISPP method may be used.

For example, when the level "11" (pre-programmed state) and the level "01" (programmed state level next to the pre-programmed state) are programmed while setting the boosting voltage ΔVpgm of the ISPP as 0.1V, the distributed voltage may be about 0.2V theoretically. However, this may increase to about 0.4V due to interferences between the memory cells. Consequently, as shown in FIG. 7A, the difference between the maximum threshold voltage of the memory cell in the programmed state (the maximum threshold voltage in the level "10") and the minimum threshold voltage of the memory cell in the pre-programmed state (the minimum threshold voltage in the level "11") is about 5V, and the lateral electric field is about 1 Mv/cm when the distance between the adjacent memory cells is about 30 nm. Therefore, the degradation of the retention property, which is caused by the lateral movement of the charges, may be prevented.

In addition, the distribution of the threshold voltages in each of the levels in the programmed states may be set to be about 0.4V in consideration of the interference between the memory cells, and thus, the effective distance between the multiple levels of the programmed state may be maintained to be similar to that of the conventional art. Therefore, as shown in FIGS. 7A and 7B, according to the method of operating a memory device of example embodiments, the effective distance between the multiple levels of the programmed state may rarely be reduced when compared with the conventional art, and thus, the memory device operating as the multi-level cells may be configured.

Meanwhile, the four levels of a programmed state formed by applying the programming scheme of example embodiments may be obtained by programming the memory cell in the pre-programmed state with two stages.

Figure 8A:
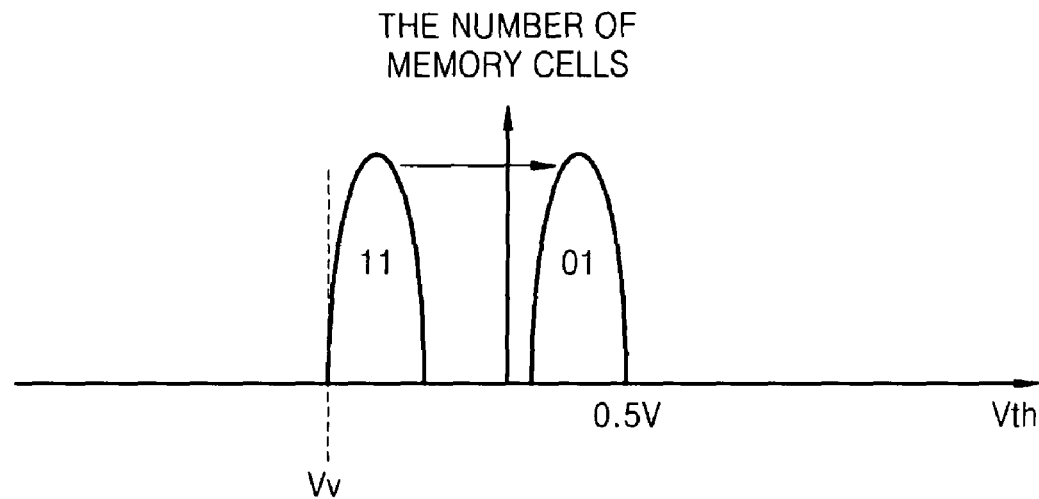
FIGS. 8A and 8B are diagrams showing an example of programming the memory cell in the pre-programmed state to be in the four levels of a programmed state shown in FIG. 7A through two stages of programming.
Figure 8B:
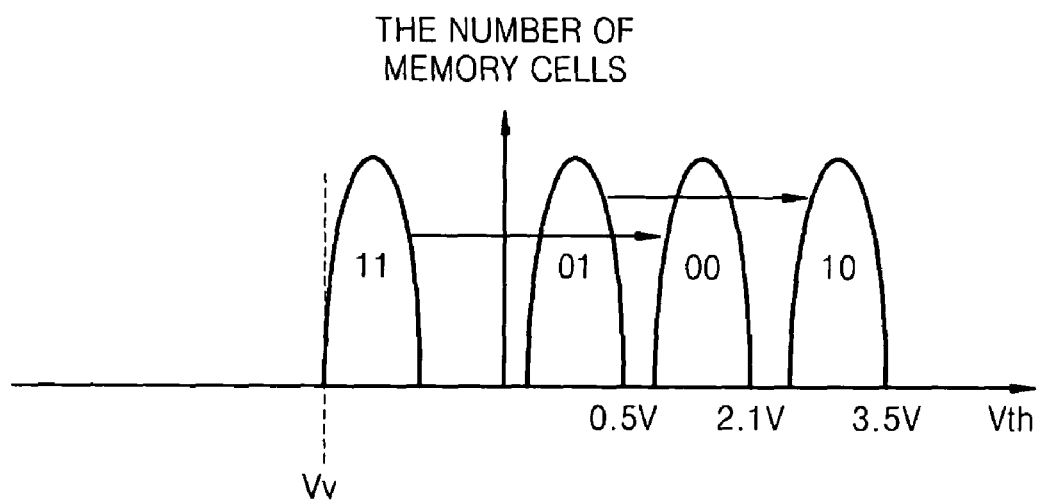

FIGS. 8A and 8B illustrate an example of programming the memory cell in the pre-programmed state to be in the four levels of a programmed state shown in FIG. 7A by using two stages of programming.

Referring to FIG. 8A, a first stage of programming may be performed on the memory cells in the pre-programmed state to program least significant bits (LSB), and thus, the memory cells in the pre-programmed state ("11" state) and in a first programmed state ("01" state) that is the level adjacent to the pre-programmed state may be obtained.

Then, as shown in FIG. 8B, a second stage of programming may be performed on the memory cells in the pre-programmed state and in the first programmed state to program most significant bits (MSBs). Thus, the memory cells in the four levels of programmed states may be obtained.

In the above description, the memory device having MLCs of four levels is described as an example. For instance, the method of operating a memory device according to example embodiments may be applied to a memory device having MLCs of eight levels or sixteen levels (refer to following Tables 1, 2, and 3).

Table 1 shows the programmed state of the memory cell compared with the conventional programmed states when the method of operating the memory device of example embodiments is applied to the memory device having MLCs of four levels.

TABLE 1

| Conventional Art | Example Embodiments |
|---|---|
| 11 (Erased State) | xx (Dummy State, Erased State) |
| 10 | 11 (Pre-programmed State) |
| 01 | 10 |
| 00 | 01 |
|  | 00 |

Table 2 shows the programmed state compared with the conventional programmed state when the operating method of example embodiments is applied to the memory device having MLCs of eight levels.

TABLE 2

| Conventional Art | Example Embodiments |
|---|---|
| 111 (Erased State) | xxx (Dummy State, Erased State) |
| 101 | 111 (Pre-programmed State) |
| 100 | 101 |
| 011 | 100 |
| 010 | 011 |
| 001 | 010 |
| 000 | 001 |
|  | 000 |

Table 3 shows the programmed states compared with the conventional programmed states when the operating method of example embodiments is applied to the memory device having MLCs of sixteen levels.

TABLE 3

| Conventional Art | Example Embodiments |
|---|---|
| 1111 (Erased State) | xxxx (Dummy State, Erased State) |
| 1110 | 1111 (Pre-programmed State) |
| 1101 | 1110 |
| 1100 | 1101 |
| 1011 | 1100 |
| 1010 | 1011 |
| 1001 | 1010 |
| 1000 | 1001 |
| 0111 | 1000 |
| 0110 | 0111 |
| 0101 | 0100 |
| 0100 | 0101 |
| 0011 | 0100 |
| 0010 | 0011 |
| 0001 | 0010 |
| 0000 | 0001 |
|  | 0000 |

According to example embodiments described above, the erased state having the negative threshold voltages and widely distributed threshold voltages may not remain as a level after performing the programming operation. Therefore, when the programming of the memory device operating as MLCs is finished, the memory window (a region between the maximum threshold voltage and the minimum threshold voltage in the programmed state) may be reduced when comparing with the memory window of the memory device operating as the same levels of MLCs that is programmed using the conventional operation method. Due to the reduction of the memory window, in the CTF memory device, such as the charge trap NAND flash memory or the charge trap NOR flash memory, having a capacity of 64 Gbits or greater, in which the distance between the adjacent memory cells is about 30 nm or less, the degradation of the data retention property due to the lateral movement of the charges between the memory cells may be reduced.

Hereinafter, flash memory cells and non-volatile memory devices, to which the method of operating a memory device of the above embodiment may be applied, will be described. In addition, a process of obtaining the negative effective verifying voltage used in the operating method will be described.

The method of operating a memory device according to example embodiments may be applied to the memory device, in which the charges may move between the adjacent memory cells due to the charge potential difference, and recording data using the charge storage, for example, the charge trap flash memory device. Here, the charge trap flash memory device may have a plurality of memory cells, each cell having a charge storage layer and a control gate, and the charge storage layer may be the charge trapping layer.

Figure 9:
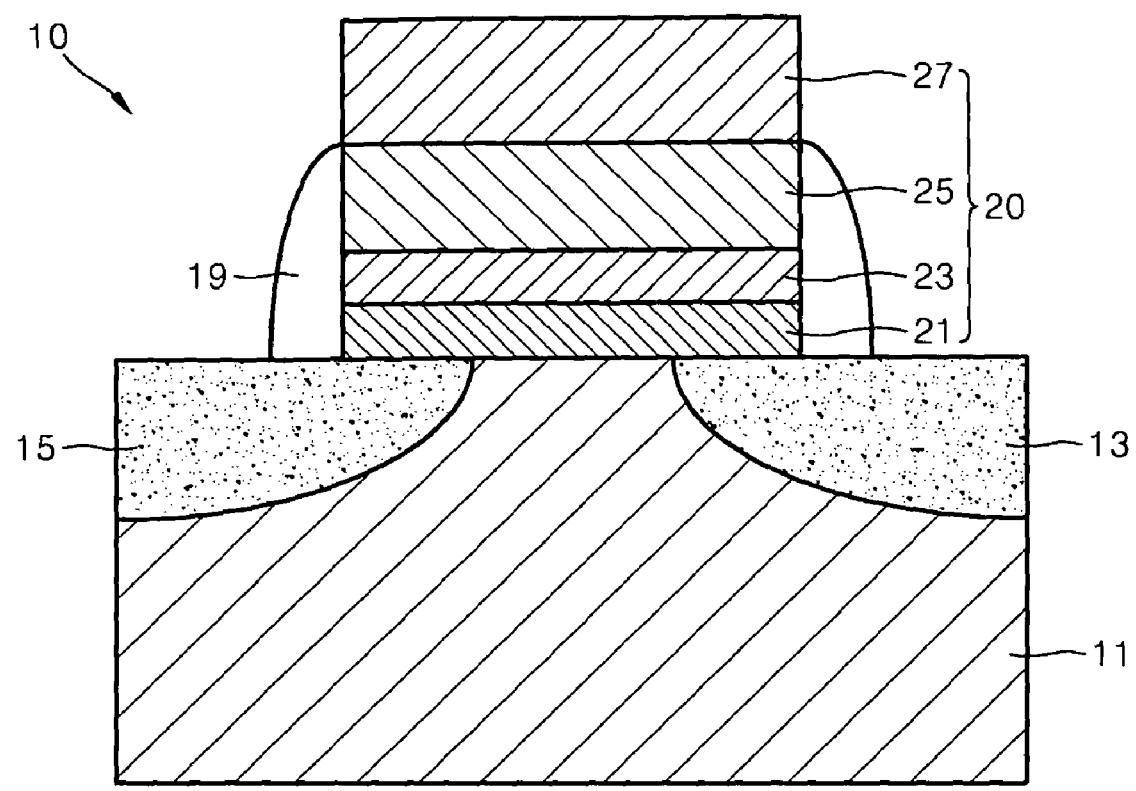
FIG. 9 is a cross-sectional view of a flash memory cell that may be programmed according to the operating method of example embodiments.

FIG. 9 is a cross-sectional view of a flash memory cell that may be programmed according to the operating method of example embodiments. The flash memory cell of FIG. 9 may form a memory cell in a NAND type flash memory device that will be described with reference to FIG. 10.

Referring to FIG. 9, the flash memory cell 10 includes a gate structure 20 formed on a substrate 11. A first impurity region 13 and a second impurity region 15, which are doped with predetermined conductive impurities, may be formed in the substrate 11. A p-well (not shown) that is doped with p-type impurities may be formed in the substrate 11. The first and second impurity regions 13 and 15 may be formed in the p-well. One of the first and second impurity regions 13 and 15 may be used as a drain, and the other may be used as a source.

The gate structure 20 includes a tunnel insulating layer 21 formed on the substrate 11, a charge storage layer 23 formed on the tunnel insulating layer 21, and a block insulating layer 25 formed on the charge storage layer 23. A control gate 27 may be formed on the block insulating layer 25. Spacers 19 may be formed as shown in FIG. 1.

The tunnel insulating layer 21 may be a layer for tunneling charges, and may be formed on the substrate 11. The first and second impurity regions 13 and 15 may be formed in the substrate 11 so as to be electrically connected to the tunnel insulating layer 21. The tunnel insulating layer 21 is a tunnel oxide layer that may be formed of, for example, SiO2 or various high-k oxide materials, or a combination of the SiO2 and the various high-k oxide materials.

Otherwise, the tunnel insulating layer 21 may be formed of a silicon nitride, for example, Si3N4. Here, the silicon nitride layer may be formed to have a concentration of impurities, which is similar to that of the silicon oxide layer, and a good interfacial property with silicon.

Also, the tunnel insulating layer 21 may be formed to have a dual-layered structure including a silicon nitride layer and an oxide layer.

As described above, the tunnel insulating layer 21 may have a single-layered structure including the oxide layer or the nitride layer, or a multiple-layered structure including materials having different energy band gaps from each other.

The charge storage layer 23 may be a region for storing information by storing charges, and may be a charge trapping layer.

For example, the charge storage layer 23 may include one of a nitride material, a high-k dielectric material having a high dielectric constant, and nanodots, so as to perform as the charge trapping layer. For example, the charge storage layer 23 may be formed of a nitride material, such as Si3N4, or a high-k oxide material, such as HfO2, ZrO2, Al2O3, HfSiON, HfON, or HfAlO. In addition, the charge storage layer 23 may include a plurality of nanodots that are arranged discontinuously as charge trap sites. In this case, the nanodots may be formed as nanocrystals. As described above, when the charge storage layer 23 is formed to function as the charge trapping layer, the flash memory cell 10 may become the CTF memory cell.

The block insulating layer 25 may prevent the charges from moving upwardly, and may be formed of an oxide layer. The block insulating layer 25 may be formed of, for example, $SiO_2$, or a high-k material having a higher dielectric constant than that of the tunnel insulating layer 21, for example, $Si_3N_4$, $Al_2O_3$, $HfO_2$, $Ta_2O_5$, or $ZrO_2$. The block insulating layer 25 may be formed to have a multiple-layered structure. For example, the block insulating layer 25 may have two or more layers including an insulating layer, which is formed of a general insulating material such as $SiO_2$, and a high dielectric layer, which is formed of a material having a higher dielectric constant than that of the tunnel insulating layer 21.

The control gate 27 may be formed of a metal layer. For example, the control gate 27 may be formed of TaN, Al, Ru, or a silicide material such as NiSi.

When electrons are injected into the CTF memory cell, the injected electrons may be stored in the charge storage layer 23 and the threshold voltage of the CTF memory cell may change.

FIG. 9 shows a top gate type flash memory cell, in which a control gate is located on a top portion of a memory cell. However, the memory cell in the non-volatile memory device, to which the operating method of example embodiments may be applied, is not limited to the above example. For example, the memory cell may be a bottom gate type, in which a control gate is located under a charge storage layer.

The method of operating a memory device according to example embodiments may be applied to program the CTF memory device having the above-described CTF memory cells.

Figure 10:
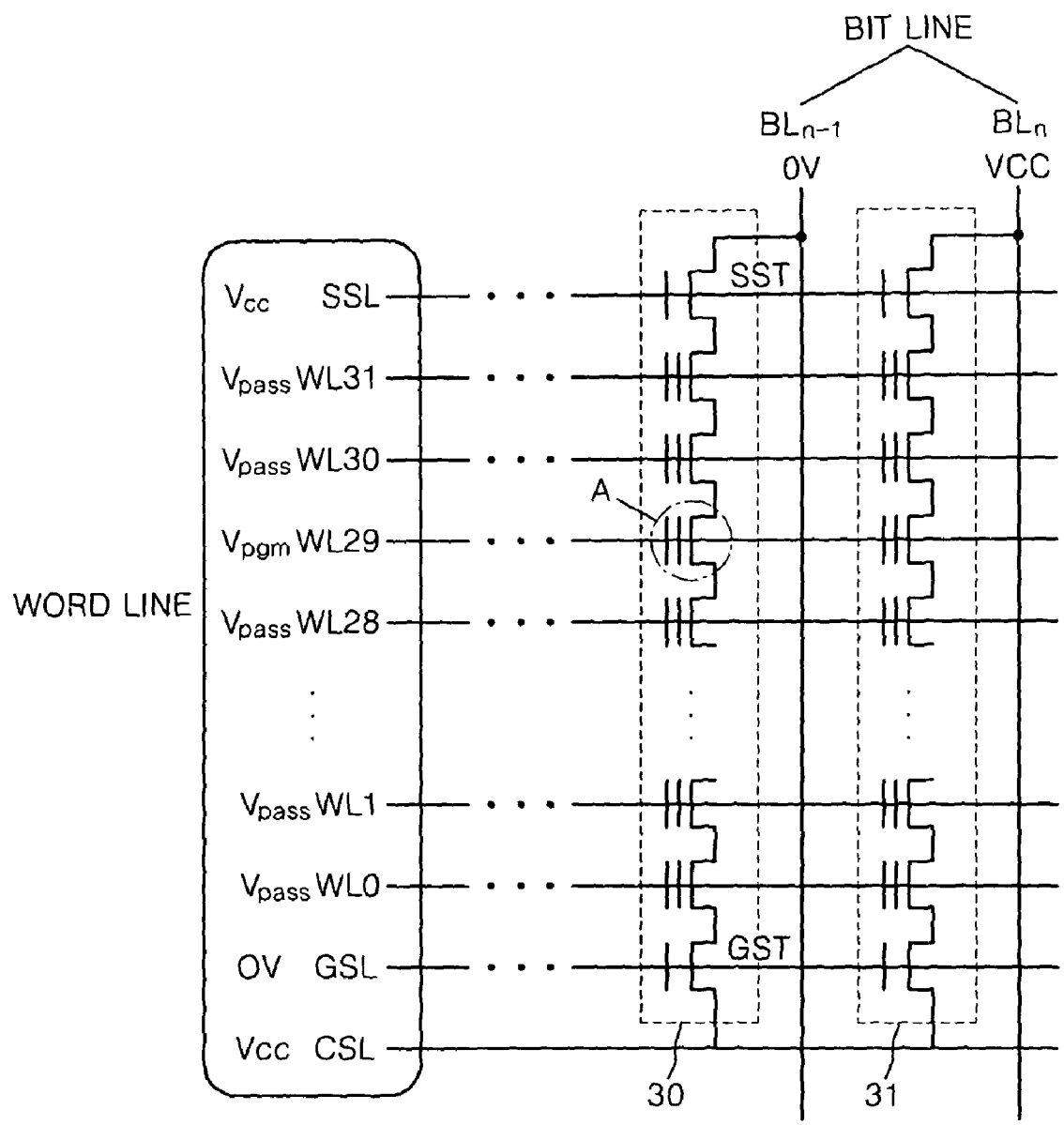
FIG. 10 is a schematic circuit diagram of a NAND type flash memory device, to which the programming scheme of example embodiments is applied.

FIG. 10 is a schematic circuit diagram of a NAND type flash memory device as an example of the memory device to which the programming scheme according to example embodiments may be applied.

Referring to FIG. 10, the NAND type flash memory device may include a plurality of cell strings. In FIG. 10, two cell strings 30 and 31 that are connected to bit lines are illustrated for the convenience of explanation.

Each of the cell strings 30 and 31 may include an array of a plurality of memory cells, each sharing a source/drain with adjacent memory cells. Each of the memory cells in a cell string may be the CTF memory cell of FIG. 9.

A ground selection transistor (GST), the memory cells, and a string selection transistor (SST) are connected in series in the cell string. An end of the cell string is connected to the bit line, and the other end of the cell string is connected to a common source line (CSL). For example, the GST may be connected to the CSL, and the SST is connected to the bit line.

Word lines WL are respectively connected to the control gates of the memory cells in a direction crossing the cell strings, a string selection line (SSL) is connected to a gate of the SST, and a ground selection line (GSL) is connected to a gate of the GST. FIG. 10 indicates as an example that each of the cell strings 30 and 31 includes thirty two memory cells, and each of the memory cells is respectively connected to each of the word lines WL0-WL31.

The data programmed into a memory cell may vary depending on a voltage of a bit line. If the voltage of the bit line is a power voltage Vcc, the programming may be inhibited. However, when the voltage of the bit line is a grounding voltage (0V), the programming of any memory cell connected to the bit line may be performed. In FIG. 10, the grounding voltage (0V) may be applied to the bit line $BL_{n-1}$, and the power voltage $V_{cc}$ may be applied to the bit line $BL_n$, as an example.

When programming, a programming voltage $V_{pgm}$ is applied to a selected word line, for example, the word line WL29. Passing voltages $V_{pass}$ may be applied to unselected word lines, for example, word lines WL31, WL30, and WL28-WL0, the grounding voltage (0V) may be applied to the GSL, and the power voltage $V_{cc}$ may be applied to the SSL. For example, the programming voltage $V_{pgm}$ may increase gradually by 0.5V from a base voltage of 16V, and the passing voltage $V_{pass}$ may be a voltage of 9V.

In the selected word line WL29, the memory cell connected to the bit line $BL_{n-1}$, to which the grounding voltage is applied, may be programmed. In FIG. 10, the memory cell A may be programmed.

Figure 11:
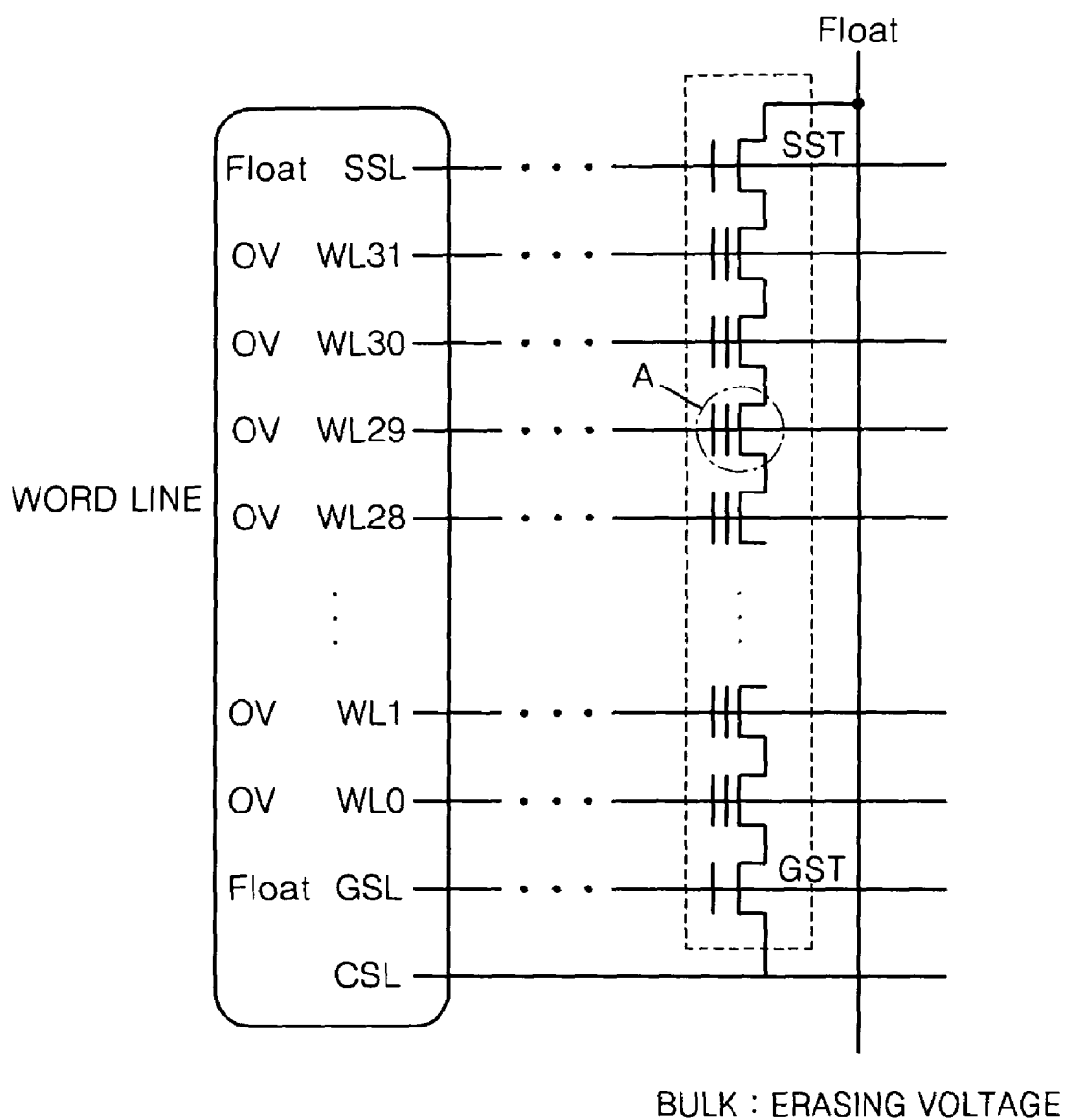
FIG. 11 is a circuit diagram showing an erasing operation of a cell string in the NAND type flash memory device of FIG. 10.

FIG. 11 illustrates an erasing operation of the cell string in the NAND type flash memory device of FIG. 10. Referring to FIG. 11, in the erasing operation, the bit line may be floated, the gate of the GST connecting to the GSL and the gate of the SST connecting to the SSL may be floated, and the grounding voltage 0V may be applied to each of the word lines. In addition, the erasing voltage, for example, a voltage of 19V to 20V, may be applied to a bulk (for example, p-well).

Figure 12:
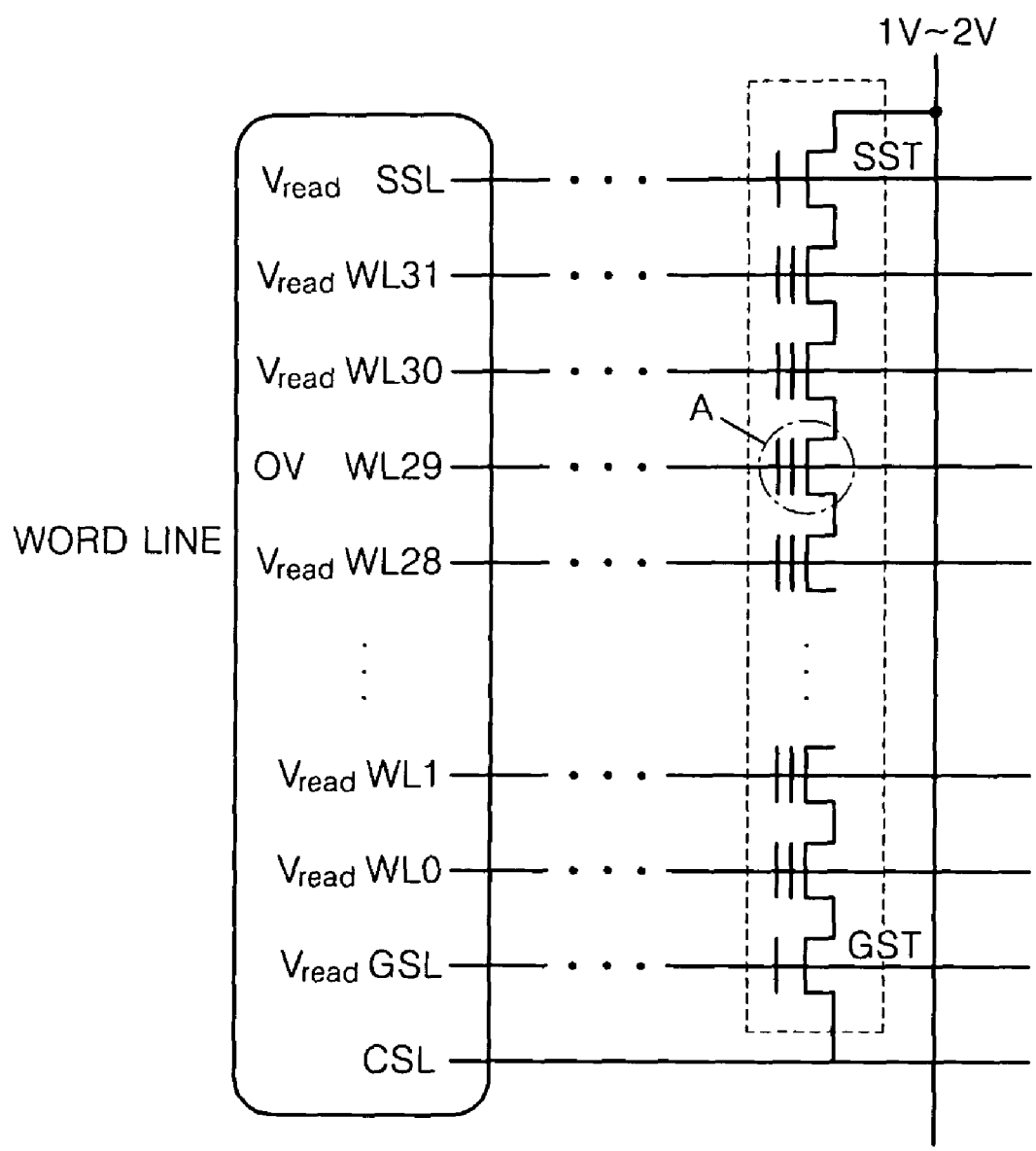
FIG. 12 is a circuit diagram showing a reading operation of a cell string in the NAND type flash memory device of FIG. 10.

FIG. 12 illustrates a reading operation of the cell string in the NAND type flash memory device of FIG. 10. Referring to FIG. 12, in the reading operation, the grounding voltage 0V may be applied to the selected word line, for example, the word line WL29, a passing voltage of the reading operation (Vread, hereinafter referred to as read voltage) may be applied to remaining unselected word lines, for example, word lines WL31, WL30, and WL28-WL0, the SSL, and the GSL, and a voltage greater than 0V, for example, a voltage of 1V to 2V, may be applied to the bit line. The read voltage Vread may be 5V to 6V.

Figure 13:
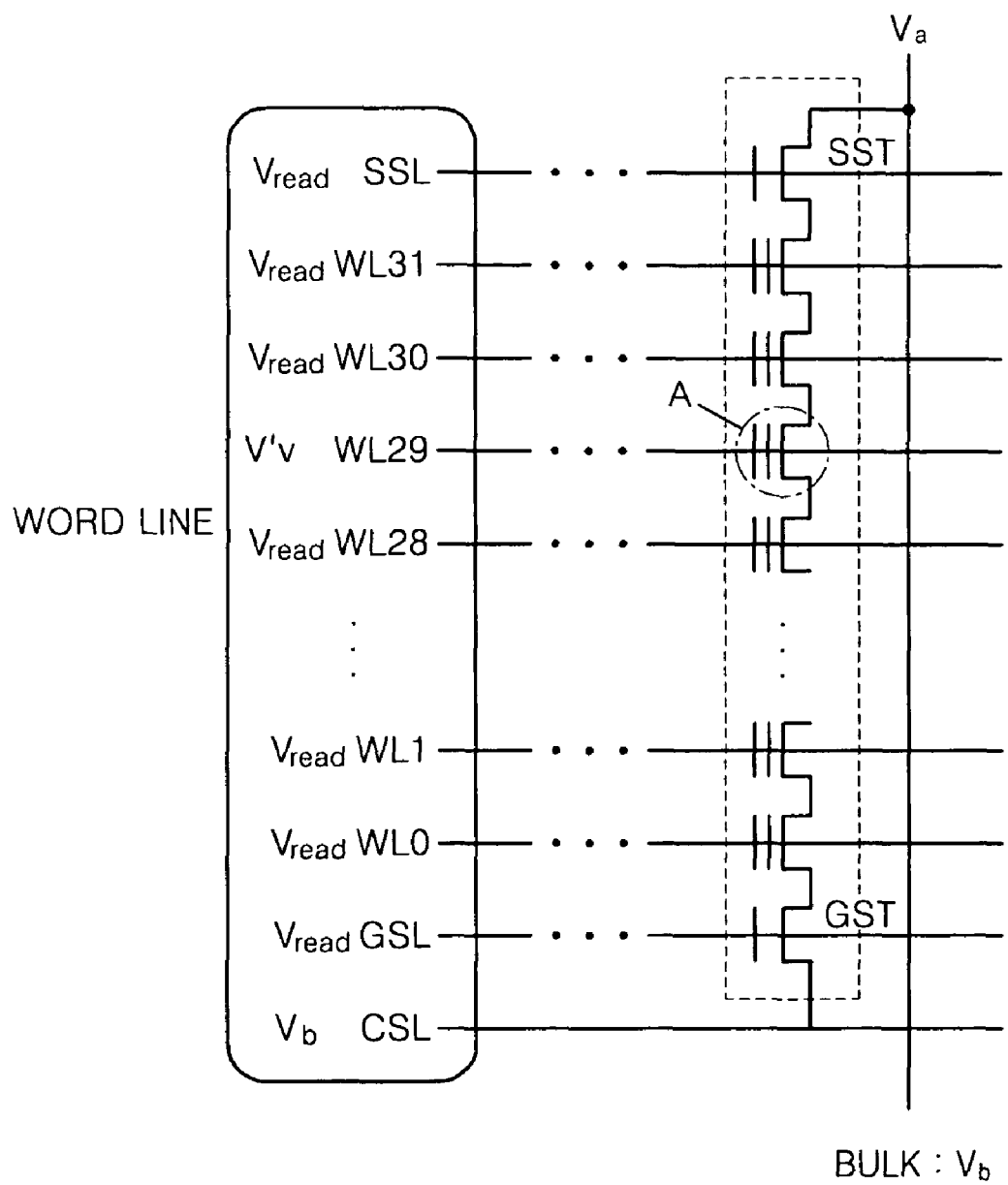
FIG. 13 is a circuit diagram showing a verifying operation of a cell string in the NAND type flash memory device of FIG. 10, when using the operating method according to example embodiments.

FIG. 13 illustrates a verifying operation of the cell string in the NAND type flash memory device of FIG. 10 when the operating method of example embodiments is applied to the memory device. Referring to FIG. 13, when performing the verifying operation, a verifying voltage V'v that is 0V or higher may be applied to the selected word line, for example, the word line WL29, and the read voltage Vread may be applied to the remaining unselected word lines, for example, the word lines WL31, WL30, and WL28-WL0, to the SSL, and to the GSL. A voltage Va that is higher than 0V, for example, a voltage obtained by adding a voltage Vb applied to the bulk and the CSL to the voltage that is generally applied to the bit line, such as Va=Vb+(1V-2V), may be applied to the bit line. The read voltage Vread may be 5V-6V.

If the above voltages are applied to the bit line, the bulk, and the CSL, an effective voltage applied to the selected memory cell A may be less than 0V even when the verifying voltage V'v of 0V is applied to the selected word line. Therefore, the negative effective verifying voltage may be applied to the selected memory cell A.

Figure 14:
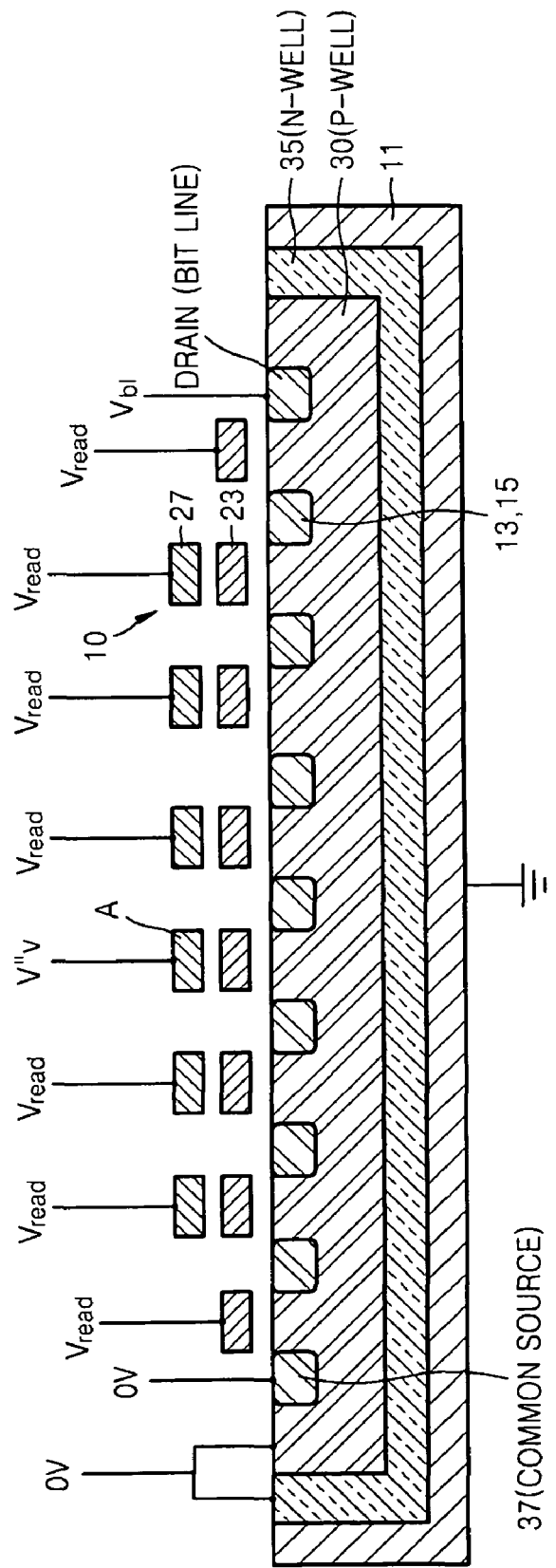
FIG. 14 is a cross-sectional view of the NAND type flash memory device in a bit line direction illustrating the verifying operation or the reading operation according to the conventional operating method.
Figure 15:
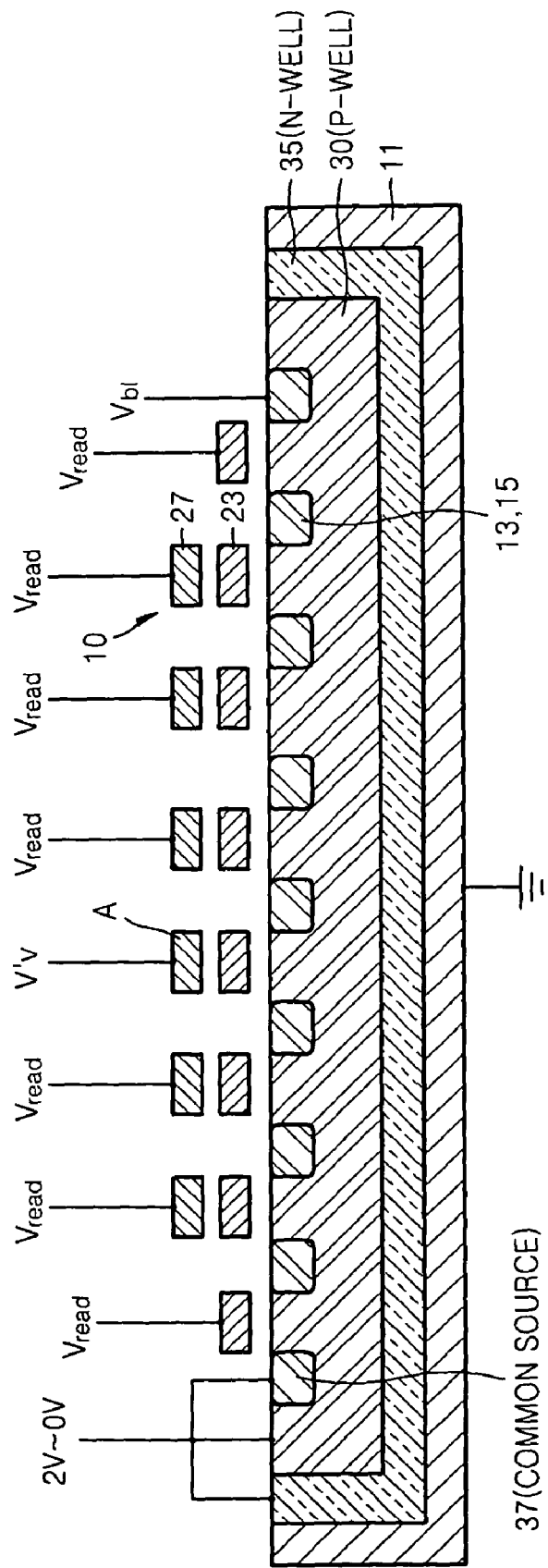
FIG. 15 is a cross-sectional views of the NAND type flash memory device in a bit line direction illustrating the operating status of the memory device according to example embodiments which may verify or read the negative threshold voltage.

FIG. 14 is a cross-sectional view of the NAND type flash memory device in a bit line direction illustrating the verifying operation or the reading operation according to the conventional operating method. FIG. 15 is a cross-sectional view of the NAND type flash memory device in a bit line direction illustrating the operating status of the memory device according to example embodiments which may verify or read the negative threshold voltage. In FIGS. 14 and 15 the erasing operation may be performed in the block unit of the NAND flash memory device. In FIGS. 14 and 15, the cell string includes six memory cells, as an example. In FIGS. 14 and 15, the same elements as those of the flash memory cell of FIG. 9 are denoted by the same reference numerals, and descriptions for those are omitted.

In the NAND type flash memory device, one block includes a plurality of cell strings as shown in FIG. 10. When the erasing operation is performed in the block unit, the block may be defined by a p-well 30 and an n-well 35. Referring to FIGS. 14 and 15, an array including a plurality of memory cells 10 is formed in the p-well 30 that is formed in the n-well 35 of the substrate 11, and adjacent memory cells arranged in series in a cell string share the first and second impurity regions 13 and 15. The first and second impurity regions 13 and 15 are formed in the p-well 30. When the block is defined by the p-well 30 and the n-well 35, the bulk, to which the voltage $V_b$ may be applied so that the negative effective verifying voltage may be applied to the selected memory cell A, may correspond to the p-well 30.

Based on the characteristics of the NAND type flash memory device, the voltage applied to the control gate 27 of the memory cell 10 may be the positive voltage, for example, equal to 0V or greater. Thus, the verifying voltage applied to the selected memory cell A may be equal to or higher than 0V.

As shown in FIG. 14, in general operation of the NAND type flash memory device, voltages applied to the p-well 30 and the n-well 35 may be maintained to be 0V, and the read voltage $V_{read}$ may be about 5V to 6V. In addition, the voltage of 0V may be applied to the source, and a bit line voltage $V_{bl}$ may be applied to the drain. In the verifying operation, the bit line voltage $V_{bl}$ may be about 1V to 2V. In addition, a verifying voltage V"v that is greater than 0V may be applied to the selected memory cell A. The above-described operation may be applied to both of the verifying operation and the reading operation, and a reading voltage, instead of the verifying voltage V"v, may be applied to the selected memory cell A in the reading operation.

According to example embodiments, in order to apply the negative effective verifying voltage Vv to the selected memory cell A, a voltage ranging from 0V to about 2V, but not 0V, may be applied to the p-well 30 in the verifying operation, as shown in FIG. 15. Accordingly, when the verifying voltage V'v that is applied through the control gate 27 of the selected memory cell A is 0V, the effective voltage that may be actually applied to the selected memory cell A may be less than 0V. Then, the negative effective verifying voltage Vv may be applied while applying the voltage of 0V or greater to the control gate of the memory cell.

Here, the voltage applied to the p-well 30 may be consistent with the common source voltage. Also, the voltage applied to the p-well 30 may be consistent with the voltage applied to the n-well 35. For example, the voltage ranging from 0V to 2V may be applied to the p-well 30, the n-well 35, and a common source 37. In addition, the bit line voltage $V_{bl}$ may increase from the generally applied voltage, for example, 1V to 2V, by as much as the voltage applied to the p-well 30.

As described above, when the voltage of 0V or a positive voltage having an absolute value that is less than that of the voltage applied to the bulk (or p-well) is applied to the selected word line while applying the positive voltage higher than 0V to the bulk (or p-well), the negative effective verifying voltage Vv may be applied to the selected memory cell A. Therefore, the pre-programmed state of the memory cell having the threshold voltages, at least some of which are less than 0V, may be verified.

While example embodiments have been shown and described, it will be understood by one of ordinary skill in the art that various changes in form and details may be made therein without departing from the spirit and scope of example embodiments as defined by the following claims.

What is claimed is:

1. A method for reducing lateral movement of charges, the method comprising:
   pre-programming at least one memory cell that is in an erased state by applying a pre-programming voltage to the at least one memory cell to have a narrower distribution of threshold voltages than the at least one erased state memory cell; and
   verifying that the pre-programmed memory cell is in the pre-programmed state using a negative effective verifying voltage, wherein
   the negative effective verifying voltage is a same voltage during the pre-programming and a programming of the at least one pre-programmed memory cell.

2. The method of claim 1, wherein at least one of the pre-programming and the verifying use the negative effective verifying voltage one or more times until the memory cell passes a verification to be in the pre-programmed state.

3. The method of claim 2, wherein the negative effective verifying voltage is between −2 volts (V) and 0 V.

4. The method of claim 1, wherein one or more of the threshold voltages in the pre-programmed state is less than 0 V.

5. The method of claim 1, further comprising:
   programming the pre-programmed memory cell using the negative effective verifying voltage, so as to have the threshold voltages of a desired programmed state.

6. The method of claim 5, further comprising:
   erasing a previously programmed state of the memory cell before performing the pre-programming.

7. The method of claim 6, wherein the erasing is performed on a plurality of memory cells until each of the memory cells have threshold voltages of less than 0 V.

8. The method of claim 1, further comprising:
   erasing a previously programmed state of the memory cell before performing the pre-programming.

9. The method of claim 8, wherein the erasing is performed on a plurality of memory cells until each of the memory cells have threshold voltages of less than 0 V.

10. A memory device configured to implement the method of claim 1.

11. The method of claim 1, wherein the pre-programming pre-programs the at least one erased memory cell regardless of a programming characteristic of the at least one erased memory cell.

12. A memory device comprising:
   an array of a plurality of memory cells sharing at least one of a source and drain formed in a p-well of a semiconductor substrate,
   wherein a first voltage and a second voltage that are greater than 0V are applied to the p-well and a common source, a voltage of one of 0V and a positive third voltage that is less than the first and second voltages is applied to a selected memory cell during verification of a pre-programmed state of the memory cell, so that a negative effective verifying voltage is applied to the selected memory cell, wherein
   the negative effective verifying voltage is a same voltage during pre-programming and programming of the selected memory cell.

13. The method of claim 12, wherein the first and second voltages applied to the p-well and the common source have a same voltage.

14. The method of claim 13, wherein the first and second voltages are greater than 0V and equal to or less than 2V.

15. The method of claim 12, wherein the drain is connected to a bit line, and a bit line voltage that is applied to the drain increases in relation to the voltage applied to the p-well when verifying the pre-programmed state of the memory cell.

16. The method of claim 12, the memory device further comprising:
an N-well formed in the semiconductor substrate, with the P-well formed in the N-well, wherein
the first voltage is applied to the N-well.

17. The method of claim 16, wherein the memory device is a NAND type flash memory device in which the plurality of memory cells are arranged as a NAND type.

18. The method of claim 17, wherein the memory cell is a charge trap flash memory cell.

19. The method of claim 12, wherein the voltage of 0V is applied to a selected memory cell.

20. The method of claim 12, wherein the positive third voltage that is less than the first and second voltages is applied to a selected memory cell.

* * * * *